United States Patent
Jeon et al.

(10) Patent No.: US 8,035,282 B2
(45) Date of Patent: Oct. 11, 2011

(54) PIEZOELECTRIC VIBRATOR AND ELECTRODE STRUCTURE OF PIEZOELECTRIC VIBRATOR

(75) Inventors: Jong Beom Jeon, Gyunggi-do (KR); Katsushi Yasuda, Gyunggi-do (KR); Jong Pil Lee, Gyunggi-do (KR); Jang Ho Park, Gyunggi-do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 94 days.

(21) Appl. No.: 12/428,030

(22) Filed: Apr. 22, 2009

(65) Prior Publication Data

US 2010/0079038 A1 Apr. 1, 2010

(30) Foreign Application Priority Data

Sep. 26, 2008 (KR) .................. 10-2008-0094541

(51) Int. Cl.
*H01L 41/08* (2006.01)
(52) U.S. Cl. ....................................................... 310/363
(58) Field of Classification Search .......... 310/363–366, 310/358, 328; *H01L 41/08, 41/09; H03H 9/13*
See application file for complete search history.

(56) References Cited

U.S. PATENT DOCUMENTS

| 7,071,599 B2 * | 7/2006 | Namerikawa et al. ........ 310/366 |
| 2006/0207078 A1 * | 9/2006 | Namerikawa et al. ........ 310/328 |

FOREIGN PATENT DOCUMENTS

| JP | 63-316912 A | 12/1988 |
| JP | 2006-033181 A | 2/2006 |
| KR | 10-2008-0046350 A | 5/2008 |

OTHER PUBLICATIONS

Korean Intellectual Property Office, Office Action issued Dec. 22, 2009.

* cited by examiner

*Primary Examiner* — Walter Benson
*Assistant Examiner* — Karen B Addison
(74) *Attorney, Agent, or Firm* — Lowe, Hauptman, Ham & Berner, LLP

(57) ABSTRACT

Provided are a piezoelectric vibrator and an electrode structure of the piezoelectric vibrator. The piezoelectric vibrator includes a piezoelectric material vibrating according to an electric signal, first and second electrode structures formed on the upper surface and the undersurface of the piezoelectric material, and including first to fourth layers sequentially stacked thereon, respectively. The first and third layers are formed of an alloy including Cr. The second and fourth layers are formed of Ag or an alloy including Ag.

13 Claims, 5 Drawing Sheets

PIEZOELECTRIC VIBRATOR AND ELECTRODE STRUCTURE OF PIEZOELECTRIC VIBRATOR

CROSS-REFERENCE TO RELATED APPLICATIONS

This application claims the priority of Korean Patent Application No. 10-2008-0094541 filed on Sep. 26, 2008, in the Korean Intellectual Property Office, the disclosure of which is incorporated herein by reference.

BACKGROUND OF THE INVENTION

1. Field of the Invention

The present invention relates to a piezoelectric vibrator and an electrode structure of the piezoelectric vibrator, and more particularly, to an electrode structure of a piezoelectric vibrator reducing the manufacturing cost and having high reliability.

2. Description of the Related Art

In general, a piezoelectric vibrator is widely used for a frequency oscillator, a frequency regulator, and a frequency converter. This piezoelectric vibrator uses a crystal having excellent piezoelectric characteristics as a piezoelectric material. In this case, the crystal serves as a stable mechanical vibrating generator.

In this case, the crystal used as a piezoelectric material is artificially grown in an autoclave under high pressure, and manufactured into a wafer form by being cut off from a crystal axis so as to have a desired characteristic. In this case, the crystal must be formed to have a low phase noise, a high quality (Q) value, and a low frequency variation rate with respect to time and environmental changes. The Q value is a value representing a band selection characteristic in a resonator, filter, and oscillator, and also referred to as a Quality Coefficient. The Q value can be obtained from a ratio of a center frequency to a bandwidth of 3 decibel dB. If the Q value becomes greater, the oscillator has a more excellent frequency selection characteristic.

FIG. 1 is a cross-sectional view illustrating a piezoelectric material and an electrode structure of a related art piezoelectric vibrator. FIG. 2 is a cross-sectional view illustrating a related art piezoelectric vibrator package. Referring to FIG. 1, the related art piezoelectric vibrator 10 includes a piezoelectric material 11, and first and second electrodes 12a and 12b. The piezoelectric material 11 is formed of a crystal piece. The first and second electrode 12a and 12b are oppositely formed on the upper surface and the undersurface of the piezoelectric material 11, respectively. This piezoelectric vibrator 10, as described in FIG. 2, may have a package structure for usage. A related art piezoelectric vibrator package includes a bottom layer 16a, first and second electrode pads 14a and 14b formed on the bottom layer 16a, a piezoelectric material 11 having one side thereof fixed on the first and second electrode pads 14a and 14b, and a bump 15 arranged between the upper surface of the bottom layer 16a and the other side of the piezoelectric material 11. In this case, as described above, the first and second electrodes 12a and 12b electrically connected to the first and second electrode pads 14a and 14b may be formed on the upper surface and the undersurface of the piezoelectric material 11. A support layer 16b forming a spatial portion accepting the crystal piece 11 is formed on the peripheral portion of the bottom layer 16a. Also, a lead 17 may be arranged on the support layer 16b to seal the spatial portion.

Generally, the first and second electrodes 12a and 12b are formed of Au having high physical and chemical stability. However, because Au is expensive, Au becomes a factor increasing the manufacturing cost in an electrode structure requiring an enough thickness, and also has a limitation of low adhesive strength to the piezoelectric material 11.

SUMMARY OF THE INVENTION

An aspect of the present invention provides a piezoelectric vibrator and an electrode structure of the piezoelectric vibrator capable of reducing the manufacturing cost and having an enhanced adhesive strength to the piezoelectric material to have high reliability.

According to another aspect of the present invention, there is provided a piezoelectric vibrator including: a piezoelectric material vibrating according to an electric signal; first and second electrode structures formed on the upper surface and the undersurface of the piezoelectric material, and including first to fourth layers sequentially stacked thereon, respectively. The first and third layers are formed of an alloy including Cr. The second and fourth layers are formed of Ag or an alloy including Ag.

In an embodiment of the present invention, the first and third layers may be formed of Cr and a material selected from the group consisting of Ti, Ni, and Al. The first and third layers may be formed of a Cr—Ni alloy. In the Cr—Ni alloy forming the first and third layers, an atomic ratio of Cr may be from about 40% to about 70%.

In an embodiment of the present invention, the second layer may be formed of Ag.

In an embodiment of the present invention, the fourth layer is formed of an Ag—Au alloy. In the Ag—Au alloy, an atomic ratio of Au may be from about 0.5% to about 40%.

In an embodiment of the present invention, a thickness of the first layer may be from about 0.5 nm to about 50 nm.

In an embodiment of the present invention, a thickness of the second layer may be from about 10 nm to about 300 nm.

In an embodiment of the present invention, a thickness of the third layer may be from about 0.5 nm to about 50 nm.

In an embodiment of the present invention, a thickness of the fourth layer may be more than about 3 nm.

According to another aspect of the present invention, there is provided an electrode structure of a piezoelectric vibrator formed on a main surface of a piezoelectric material, including a stacked structure including first to fourth layers sequentially stacked on the main surface of the piezoelectric material. The first and third layers are formed of an alloy including Cr. The second and fourth layers are formed of Ag and an alloy including Ag.

The electrode structure may include first and second electrode structures oppositely formed on the upper surface and the undersurface of the piezoelectric material.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
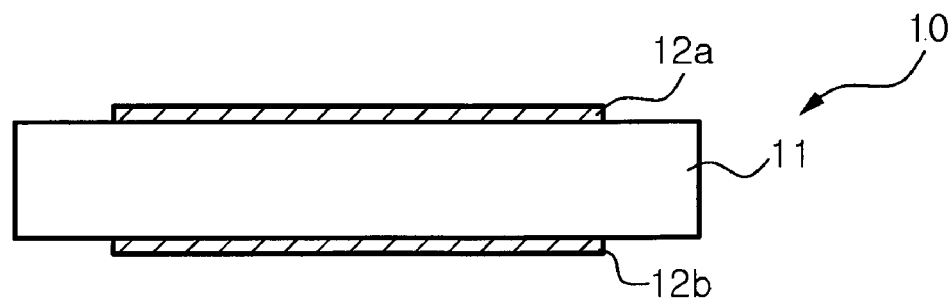
FIG. 1 is a cross-sectional view illustrating a piezoelectric material and an electrode structure of a related art piezoelectric vibrator.

Exemplary embodiments of the present invention will now be described in detail with reference to the accompanying drawings.

The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. Like reference numerals in the drawings denote like elements, and thus their description will be omitted.

Figure 3:
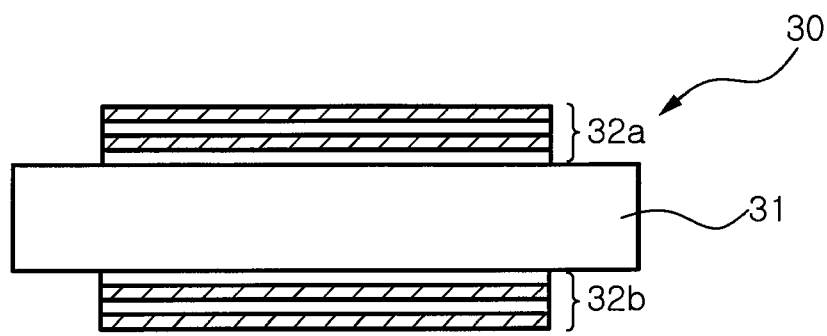
FIG. 3 is a cross-sectional view illustrating a piezoelectric vibrator according to an embodiment of the present invention.
Figure 4:
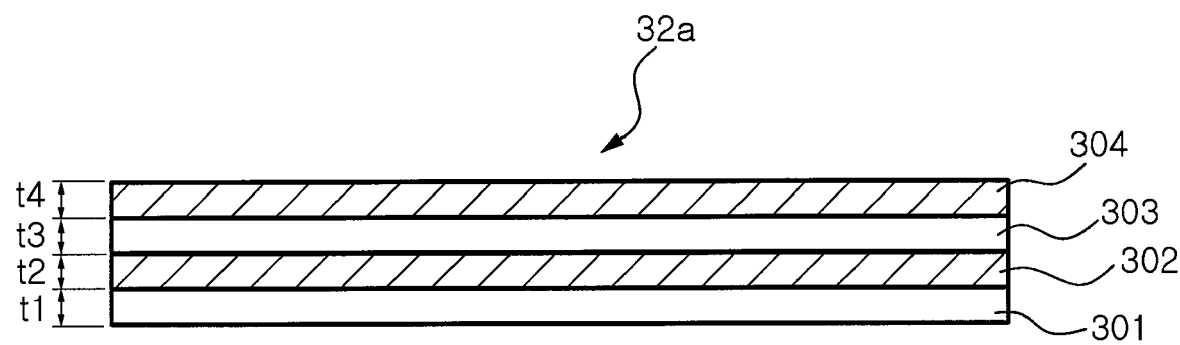
FIG. 4 is a cross-sectional view illustrating a detailed electrode structure of the piezoelectric vibrator in FIG. 3.

FIG. 3 is a cross-sectional view illustrating a piezoelectric vibrator according to an embodiment of the present invention. FIG. 4 is a cross-sectional view illustrating a detailed electrode structure of the piezoelectric vibrator in FIG. 3.

Referring to FIG. 3, the piezoelectric vibrator 30 includes a piezoelectric material 31, and first and second electrode structures 32a and 32b oppositely formed on the upper surface and undersurface of the piezoelectric material 31. The piezoelectric material 31 generates a piezoelectric effect according to an electric signal, and may be formed of a crystal piece. In this case, the piezoelectric material 31 may be formed through a cutting process of a crystal wafer.

The first and second electrode structures 32a and 32b provide an electric signal to the piezoelectric material 31 to generate a piezoelectric effect. Also, the first and second electrode structures 32a and 32b can output an electric signal according to the piezoelectric effect of the piezoelectric material 31. In this case, the first and second electrode structures 32a and 32b may be formed through a process such as depositing of materials on the upper surface and undersurface of the piezoelectric material 31. The materials will be described below.

In this embodiment, the first and second electrode structures 32a and 32b are formed in a quad-layer structure differently from a related art structure to reduce material cost and enhance reliability. Although it is described in this embodiment that both first and second electrode structures 32a and 32b have the quad-layer structure, according to embodiments, only one of the first and second electrode structures 32a and 32b may have the quad-layer structure and the other may have mono-, bi-, or tri-layer structure of the related art electrode structure.

Figure 2:
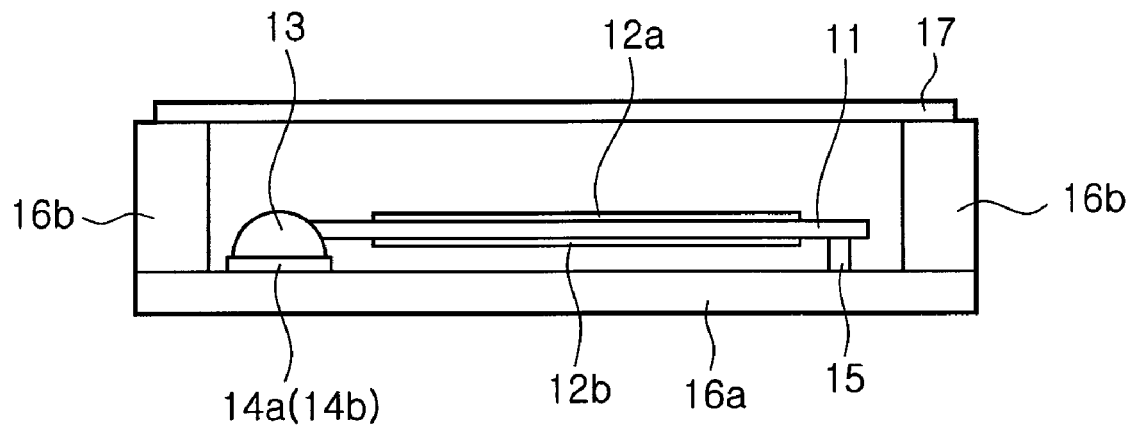
FIG. 2 is a cross-sectional view illustrating a related art piezoelectric vibrator package.

Referring to FIG. 4, the first electrode structure 32a will be described in detail. In this case, detailed description of the first electrode structure 32a can be identically applied to the second electrode structure 32b. As described in FIG. 4, the first electrode structure 32a is a structure having first layer to fourth layers 301 to 304 sequentially stacked. In this case, the first layer 301 corresponds to a layer contacting the piezoelectric material 31 of FIG. 2.

The first layer 301 is required to have high adhesive strength to the piezoelectric material. This electrode structure can have a higher adhesive strength than a mono-layer structure formed of Au. While the crystal piece used as a piezoelectric material has a thermal expansion coefficient (CTE) of about $13.7 \times 10^{-6}$ mm/° C., Au and Ag have thermal expansion coefficients of about $14.2 \times 10^{-6}$ mm/° C. and about $18.9 \times 10^{-6}$ mm/° C., respectively. Accordingly, when Ag is used instead of Au for the purpose of material cost reduction, the thermal expansion coefficient difference between the first layer 301 and the piezoelectric material may be increased thereby to cause a stress. In this embodiment, in consideration of material cost reduction, thermal expansion coefficient and adhesive strength between the first layer 301 and the piezoelectric material, the first layer 301 is formed of an alloy including Cr, more specifically, an alloy of Cr and a metal such as Ti, Ni, or Al. Specially, a Cr—Ni alloy is desirable for forming the first layer 301. In this case, the atomic ratio of Cr may be about 40% to about 70%. On the other hand, the first layer 301 may be formed to have a thickness t1 of from about 0.5 nm to about 50 nm. If the thickness t1 is less than about 0.5 nm, the adhesive strength between the first layer 301 and the piezoelectric material is weakened. If the thickness t1 is more than about 50 nm, the crystal impedance (CI) value may rise above an allowable value.

The second layer 302 is formed of Ag or an alloy including Ag. As described above, the material cost of the electrode structure can be reduced by using relatively cheaper Ag than Au. Also, by interposing a Cr alloy layer between the piezoelectric material 31 and the second layer 302 formed of Ag, an adhesive strength to the piezoelectric material 31 can be improved and the thermal expansion coefficient difference therebetween can be alleviated. The second layer 302 may be formed to have a thickness t2 of about 10 nm to about 300 nm. If the thickness t2 is less than 10 nm, a diffusion between materials forming the first layer 301 and the third layer 303 may change the vibration frequency of the piezoelectric vibrator according to the lapse of time. If the thickness t2 is more than 300 nm, the CI value may rise above an allowable value.

The third layer 303, which is a layer having the similar function to the first layer 301, is provided to enhance the adhesive strength between the second layer 302 and the fourth layer 304, and alleviate the thermal expansion coefficient difference between Ag and the piezoelectric material. That is, the third layer 303 serves to alleviate deterioration of the adhesive strength, which may be generated when the outermost fourth layer 304 is formed of Ag or an alloy including Ag. For this, the third layer 303 may be formed of Cr and a metal such as Ti, Ni, or Al. Specially, in the case of Cr—Ni alloy, the atomic ratio of Cr may be from about 40% to 70%. On the other hand, the third layer 303 may be formed to have a thickness t3 of about 0.5 nm to about 50 nm. If the thickness t3 is less than about 0.5 nm, the adhesive strength between the second layer 302 and the fourth layer 304 may be weakened. If the thickness t3 is more than about 50 nm, the CI value may rise above an allowable value.

In this embodiment, the fourth layer 304, the most outer layer of the electrode structure, is formed of Ag or an alloy including Ag similarly to the second layer 302. When the fourth layer 304 is formed of the alloy including Ag, the fourth layer may be formed of an Ag—Au alloy including Ag capable of ensuring high reliability of an electrode because of high physical and chemical stability. In this case, the atomic ratio of Au may be from about 0.5% to about 40%. Thus, according to this embodiment of the present invention, the usage of relatively expensive Au can be reduced by forming the electrode structure using Ag instead of Au of a monolayer. Also, the performance deterioration of the electrode is minimized by forming a quad-layer electrode structure, using a Cr alloy for the first layer 301 and the third layer 303 in consideration of the thermal expansion coefficient and the adhesive strength improvement, and optimizing the thickness of each layer and the alloy ratio. The fourth layer may be formed to have a thinner thickness t4 than a related art monolayer structure. This is because the oxidation of Ag may cause changes of electrical characteristics. However, the thickness t4 of the fourth layer 304 may be more than about 3 nm for an appropriate functional performance. If the thickness t4 is less than about 3 nm, a diffusion of a material forming the third layer 303 may cause a change of the vibration frequency of the piezoelectric vibrator according to the lapse of time. Also, as described in FIG. 6, this is because it is not easy to regulate the frequency while removing the fourth layer 304.

Figure 5:
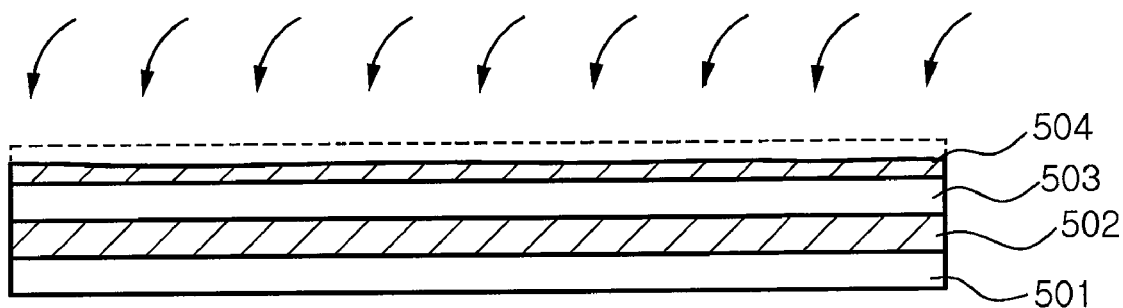
FIGS. 5 and 6 are cross-sectional views illustrating a process of regulating the frequency in the electrode structure of the piezoelectric vibrator in FIG. 3.
Figure 6:
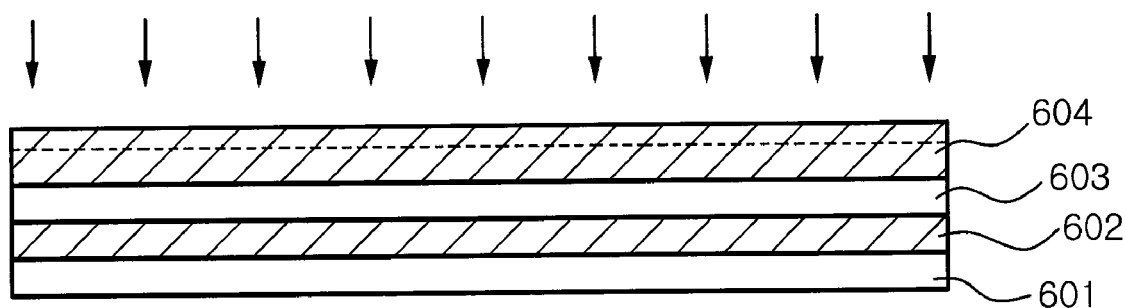

The piezoelectric vibrator having the electrode of the structure described above may be mounted in a package, and then pass through a frequency regulation step after a heat treatment. FIGS. 5 and 6 are cross-sectional views illustrating a process of regulating the frequency in the electrode structure of the piezoelectric vibrator in FIG. 3.

First, as described in FIG. 5, in an electrode structure having first to fourth layers 501 to 504, the frequency characteristic of the piezoelectric material may be varied with the whole thickness of the electrode structure, and accordingly, the frequency can be regulated while increasing the thickness of the fourth layer 504. In this case, a desired frequency characteristic can be obtained by increasing the thickness of the fourth layer 504 through a deposition of Ag or an alloy including Ag on the upper surface of the third layer 503 (mass increase method).

On the contrary, as described in FIG. 6, in an electrode structure having first to fourth layers 601 to 604, a desired frequency characteristic can be obtained by reducing the thickness of the fourth layer 604, that is, by delicately removing the fourth layer 604 through an irradiation of electron beam, laser beam, or ion beam on the fourth layer 604 formed of a material including Ag (mass reduction method).

After frequency is regulated as described above, a piezoelectric vibrator can be completed through a heat treatment process and a sealing process to alleviate a stress that may occur in the frequency regulation process.

Figure 7:
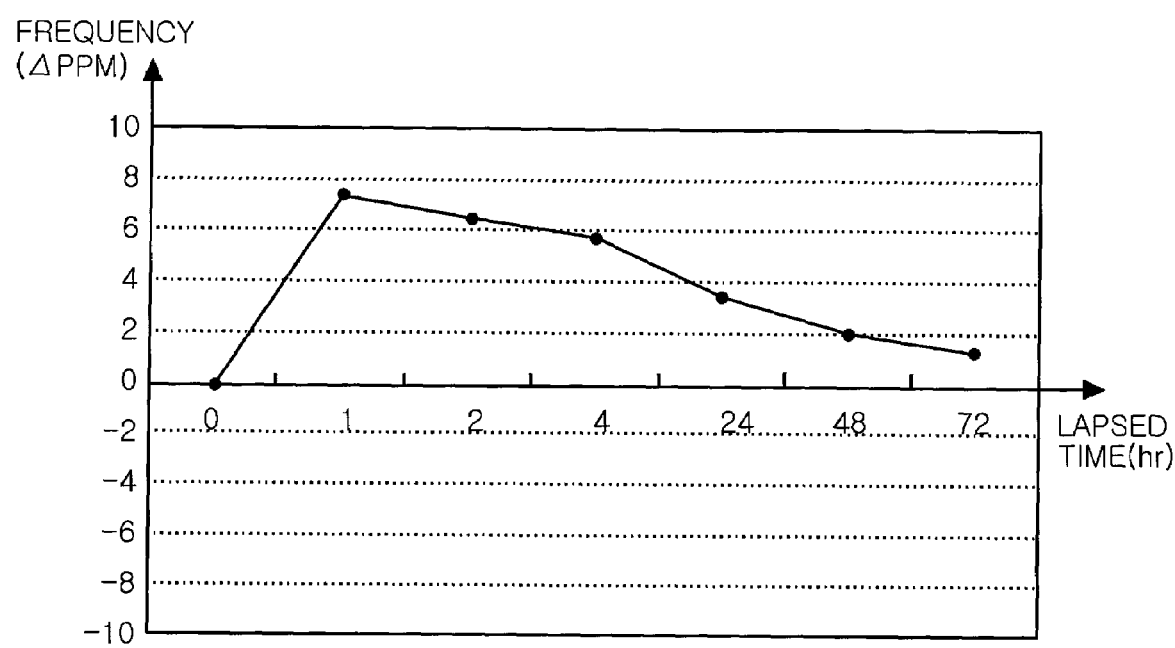
FIGS. 7 and 8 are graphs illustrating frequency characteristics according to the lapse of time after a reflow process in piezoelectric vibrators employing electrode structures according to a comparative example and an embodiment, respectively.
Figure 8:
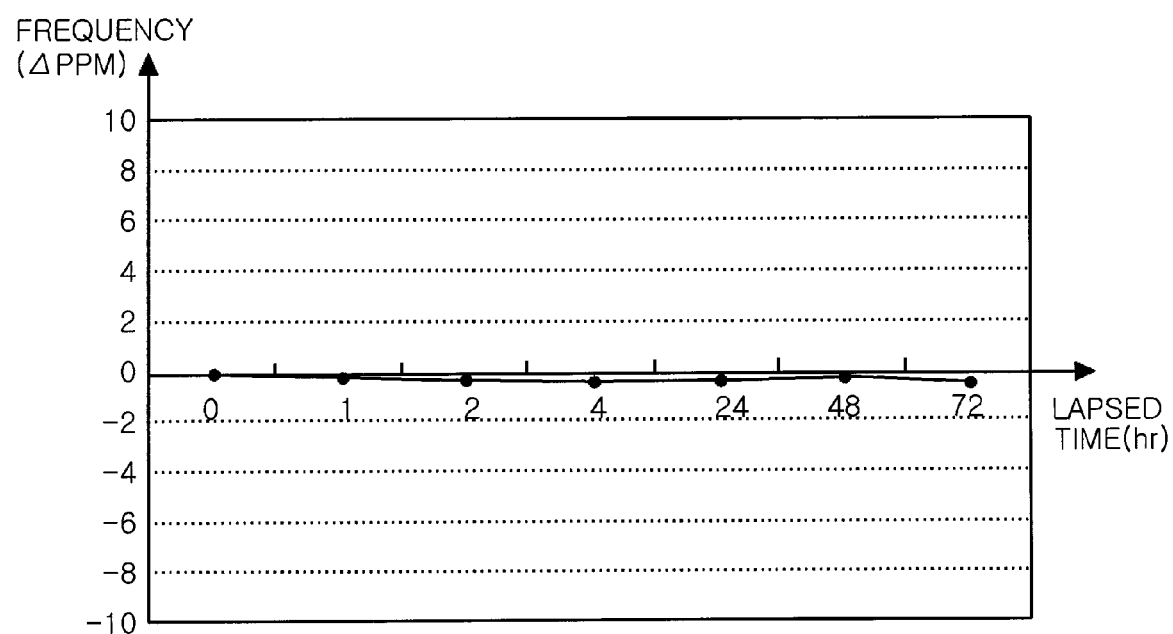

FIGS. 7 and 8 are graphs illustrating frequency characteristics according to the lapse of time after a reflow process in piezoelectric vibrators employing electrode structures according to a comparative example and an embodiment, respectively. First, the electrode structure according to the comparative example includes a bi-layer structure. A first layer is formed of a Ni—Cr alloy, and the second layer is formed of Ag. Referring to FIG. 7, while the electrode structure according to the comparative example returns to an original condition after a hardening of about 72 hours, there is a significant change of the frequency until then. This is because a stress occurs at an interface between electrode layers, or at an interface between a crystal piece and an electrode due to expansion and contract by an external environment. On the other hand, in the electrode structure according to the embodiment, first and third layers are formed of a Ni—Cr alloy, and second and fourth layers are formed of Ag. Referring to FIG. 8, it is shown that there is little change in frequency variation according to the lapse of time in the electrode structure according to the embodiment. Accordingly, it can be appreciated that the electrode structure according to the embodiment represents very stable characteristics with respect to the external temperature change.

According to the embodiments of the present invention, a piezoelectric vibrator and an electrode structure of the piezoelectric vibrator can reduce the manufacturing cost and have an enhanced adhesive strength to the piezoelectric material to have high reliability.

While the present invention has been shown and described in connection with the exemplary embodiments, it will be apparent to those skilled in the art that modifications and variations can be made without departing from the spirit and scope of the invention as defined by the appended claims.

What is claimed is:

1. A piezoelectric vibrator, comprising:
   a piezoelectric material for vibrating according to an electric signal; and
   first and second electrode structures formed on the upper surface and the undersurface of the piezoelectric material, respectively, each of the first and second electrode structures comprising first to fourth layers sequentially stacked thereon,
   wherein the second and fourth layers are formed of Ag or an alloy comprising Ag,
   wherein the first and third layers are formed of an alloy comprising Cr and a material selected from the group consisting of Ti, Ni, and Al, and
   wherein a thickness of the first layer is from 0.5 nm to 50 nm.

2. The piezoelectric vibrator of claim 1, wherein the first and third layers are formed of a Cr—Ni alloy.

3. The piezoelectric vibrator of claim 2, wherein, in the Cr—Ni alloy forming the first and third layers, an atomic ratio of Cr is from about 40% to about 70%.

4. The piezoelectric vibrator of claim 1, wherein the second layer is formed of Ag.

5. The piezoelectric vibrator of claim 1, wherein the fourth layer is formed of an Ag—Au alloy.

6. The piezoelectric vibrator of claim 5, wherein, in the Ag—Au alloy, an atomic ratio of Au is from about 0.5% to about 40%.

7. The piezoelectric vibrator of claim 1, wherein a thickness of the second layer is from 10 nm to 300 nm.

8. The piezoelectric vibrator of claim 1, wherein a thickness of the third layer is from 0.5 nm to 50 nm.

9. The piezoelectric vibrator of claim 1, wherein a thickness of the fourth layer is more than about 3 nm.

10. The piezoelectric vibrator of claim 1, wherein the fourth layers completely cover the respective third layers.

11. The electrode structure of claim 1, wherein a thickness of the fourth layer is set to regulate a desired frequency of the piezoelectric vibrator.

12. An electrode structure of a piezoelectric vibrator formed on a main surface of a piezoelectric material, the electrode structure comprising:
    a stacked structure comprising first to fourth layers sequentially stacked on the main surface of the piezoelectric material, the second and fourth layers being formed of Ag or an alloy comprising Ag,
    wherein the first and third layers are formed of an alloy comprising Cr and a material selected from the group consisting of Ti, Ni, and Al, and
    wherein a thickness of the first layer is from 0.5 nm to 50 nm.

13. The electrode structure of claim 12, wherein the electrode structure comprises first and second electrode structures oppositely formed on the upper surface and the undersurface of the piezoelectric material.

* * * * *